United States Patent [19]

Okuda et al.

[11] Patent Number: 5,289,018
[45] Date of Patent: Feb. 22, 1994

[54] LIGHT EMITTING DEVICE UTILIZING CAVITY QUANTUM ELECTRODYNAMICS

[75] Inventors: Masahiro Okuda, Sagamihara; Akira Shimizu, Tokyo, Japan

[73] Assignee: Canon Kabushiki Kaisha, Tokyo, Japan

[21] Appl. No.: 61,328

[22] Filed: May 14, 1993

Related U.S. Application Data

[63] Continuation of Ser. No. 741,068, Aug. 6, 1991, abandoned.

[30] Foreign Application Priority Data

Aug. 14, 1990 [JP] Japan .................... 2-214812

[51] Int. Cl.$^5$ .................................................... H01L 33/00
[52] U.S. Cl. ........................................ 257/98; 257/83; 257/94; 372/45; 372/46; 372/50; 372/99
[58] Field of Search ................. 357/4, 16, 17; 372/43, 372/45, 46, 96, 50, 99; 257/83, 94, 98

[56] References Cited

U.S. PATENT DOCUMENTS

| | | | |
|---|---|---|---|
| 4,675,877 | 6/1987 | Svilans | 357/17 |
| 4,742,378 | 5/1988 | Ito et al. | 357/17 |
| 4,796,067 | 1/1989 | Shimizu et al. | 357/4 |
| 4,833,507 | 5/1989 | Shimizu et al. | 357/4 |
| 4,835,578 | 5/1989 | Ohtoshi et al. | 357/4 |
| 4,930,132 | 5/1990 | Shimizu et al. | 372/22 |
| 4,943,970 | 7/1990 | Bradley | 357/4 |
| 4,949,350 | 8/1990 | Jewell et al. | 357/4 |
| 4,993,036 | 2/1991 | Ikeda et al. | 372/50 |
| 4,999,842 | 3/1991 | Huang et al. | 357/4 |
| 5,029,176 | 7/1991 | Chang-Hasnain | 372/45 |
| 5,033,053 | 7/1991 | Shimizu et al. | 372/50 |
| 5,034,958 | 7/1991 | Kwon et al. | 357/4 |
| 5,038,356 | 8/1991 | Botez et al. | 372/45 |
| 5,068,868 | 11/1991 | Deppe et al. | 357/4 |
| 5,070,375 | 12/1991 | Sakai | 357/16 |
| 5,073,893 | 12/1991 | Kondou | 372/45 |

FOREIGN PATENT DOCUMENTS

| | | | |
|---|---|---|---|
| 62-188385 | 8/1987 | Japan | 357/17 |
| 1-10946 | 4/1989 | Japan | 357/19 |
| 1-264275 | 10/1989 | Japan | 357/17 |
| 2-125670 | 5/1990 | Japan | 357/17 |

OTHER PUBLICATIONS

Lenz et al., "Bragg confinement of carriers in a quantum barrier", Appl. Phys. Lett. 56 (9), Feb. 26, 1990.
Arakawa et al., "Quantum well lasers-Gain, Spectra, Dynamics", IEEE Jour. of Quan. Elec., vol. QE-22, No. 9, Sep. 1986.
"GaAs/AlGaAs Optical Interconnection Chip for Neural Network" by Y. Nitta et al. Japanese Journal of Applied Physics; vol. 28. No. 11, Nov. 1989 JP, pp. 2101–2103.
"Room-Temperature Operation Of Three Terminal Quantum-Confined Field-Effect Light Emitters" by Y. Kan et al., Applied Physics Letters, vol. 56, Tokyo, JP No. 21, May 21, 1990, New York, US. pp. 2059–2061.
"Lasing Acting In GaInAs/GaInAsP Quantum Wire Structure" by M. Cao et al. Transactions Of The Institute of Electronics, Information, vol. E73, No. 1, Jan. 1990, Tokyo, Japan pp. 63–39.
"Cavity Quantum Electrodynamics" by S. Haroche et al. Physics Today, Jan. 1989, pp. 24–30.
"Quantum mechanical Size Effect Modulation Light Sources-A New Field Effect Semiconductor Laser Or Light Emitting Device" by M. Yamanishi Japanese Journal of Applied Physics, vol. 22, 1983, pp. L22–L24.
"Qauntum Optics and New Technology" by Y. Yamamoto et al., Japanese Electronic Information Communication Society Journal, Sep. 1989, pp. 1014–1020.

Primary Examiner—Rolf Hille
Assistant Examiner—Minhloan Tran
Attorney, Agent, or Firm—Fitzpatrick, Cella, Harper & Scinto

[57] ABSTRACT

A light emitting device includes a light emitting active layer, electrodes to supply carriers to the active layer and a resonator enclosing the active layer with high reflectance for light radiated in the active layer. An electrode may be used to apply an electric field to change the wavelength of light radiated in the active layer. The spontaneous emission probability is controlled or modified to obtain high light emission efficiency or a high degree of light modulation.

23 Claims, 3 Drawing Sheets

LIGHT EMITTING DEVICE UTILIZING CAVITY QUANTUM ELECTRODYNAMICS

This application is a continuation of application Ser. No. 07/741,068 filed Aug. 6, 1991, now abandoned.

BACKGROUND OF THE INVENTION

1. Field of the Invention

This invention relates to a light emitting apparatus for use as a light source, a light modulator and the like suitable for optical communications, especially, parallel and large capacity optical transmission between electric circuit elements and the like and which have extremely high light emission efficiency, and, more particularly, to light emitting devices utilizing cavity quantum electrodynamics.

2. Related Background Art

In recent years, technologies for linking the electric circuits using light are expected to overcome the signal delay due to capacitances resulting from electric distribution wires in the large scale integration (LSI), etc. For the purposes of electric linkage, semiconductor lasers have been utilized as light emitting devices. However, the semiconductor laser generally requires a very large injection current density. As a result, integration of many semiconductor lasers on a common substrate causes problems of overheating in the elements and of degraded reliability. As a result, the semiconductor laser is not believed to be suitable as a light emitting device for light transmission between proximate electric circuits.

To solve these problems, there have been developed field-effect type light emission devices having quantum well structures, as is disclosed, for example, in JJAP., vol. 22, pp. L22–L24 (1982). In these devices, the modulation of the number of carriers, done in conventional elements, is not performed, and instead the light emission or radiation rate itself is modulated by spatially separating electrons from holes due to an electric field applied perpendicularly to a quantum well active layer. Therefore, high-speed switching operation is achieved, which is unrelated to the recombination life time of carriers that has been limiting the switching time of the conventional light emitting devices.

Thus, if the above device is utilized as the above-mentioned light emitting device for optical linkage, such optical signal switching becomes possible at very high speed of the order of 10 psec although the injection current density is extremely low. For instance, in the case where a multiplicity of such light emitting devices are arranged on a common substrate, it will be expected that heat generation is low. At the same time excellent characteristics are obtained with respect to the uniformity of light emission and the reliability of the device compared with semiconductor lasers.

However, in the prior art field-effect type light emitting device having quantum well, the depth of modulation of light emission is at most about 10:1 to 20:1 since this depth is determined by the ratio between the light emission recombination times at light emission and non-light emission times.

Further, although the internal quantum efficiency (the ratio between the number of injected electrons and the number of generated photons) is very high, there exists the shortcoming that light could not effectively be output, which is a drawback common to such devices that emit spontaneous emission light. In general, this is due to the large refractive index of a semiconductor of the light emission active layer and because total reflection occurs in usual structures.

SUMMARY OF THE INVENTION

An object of this invention is to provide a light emitting device having a structure that achieves a deep depth of modulation or on/off ratio or can supply higher intensity light and so on, utilizing cavity quantum electrodynamics.

According to one aspect of the invention, the device comprises a light emitting active layer; means for supplying carriers to the active layer; and reflector means enclosing the active layer having a high reflectance for light radiated in the active layer.

According to another aspect of the invention, the device further comprises means for applying an electric field to the active layer to change the wavelength of light radiated therein.

These advantages and others will be more readily understood in connection with the following detailed description, claims and drawing.

DESCRIPTION OF THE PREFERRED EMBODIMENT

It is a basic principle of this invention that the probability of spontaneous emission in the light emitting active layer of a device is greatly enhanced or is changed by a voltage applied to the active layer. In general, the spontaneous emission probability is represented by so-called Fermi's golden rule $$S = 1/h^2 \cdot \int_0^\infty |M(\nu)|^2 D(\nu) g(\nu) d\nu$$

where $M(\nu)$ is the element of a matrix of an electric dipole interaction Hamiltonean, $D(\nu)$ is the state or mode density of an electromagnetic field or light, $g(\nu)$ is the shape of a spectrum of an excited electron system. The $M(\nu)$ is a function which is proportional to the sum of a dipole moment of transition from an electron excited state to be a ground state and a fluctuation of a vacuum field. In the above stated prior art quantum well field-effect type light emission device, the dipole moment of electron transition of $M(\nu)$ is changed as the means for varying the spontaneous emission probability S.

In sharp contrast thereto, in the present invention, a minute resonator or cavity is constructed for the light radiated in the active layer. As a result, the electromagnetic field of light is quantized. Thus, the fluctuation of a vacuum field of $M(\nu)$ is also set to a certain value or changed, and at the same time $D(\nu)$ is concentrated at a certain frequency. Further, $g(\nu)$ may be shifted in frequency $\nu$ due to the Quantum Confined Stark Effect (QCSE) resulting from the electric field applied to the active layer. As a result, the manner of superposition of $M(\nu)$, $D(\nu)$ and $g(\nu)$ is controlled or changed and hence the spontaneous emission probability can be controlled or greatly changed (see, for example, Japanese Electronic Information Communication Society Journal Sep. 1989, pp. 1014–1020, and Physics Today January 1989, pp. 24–30).

Figure 1:
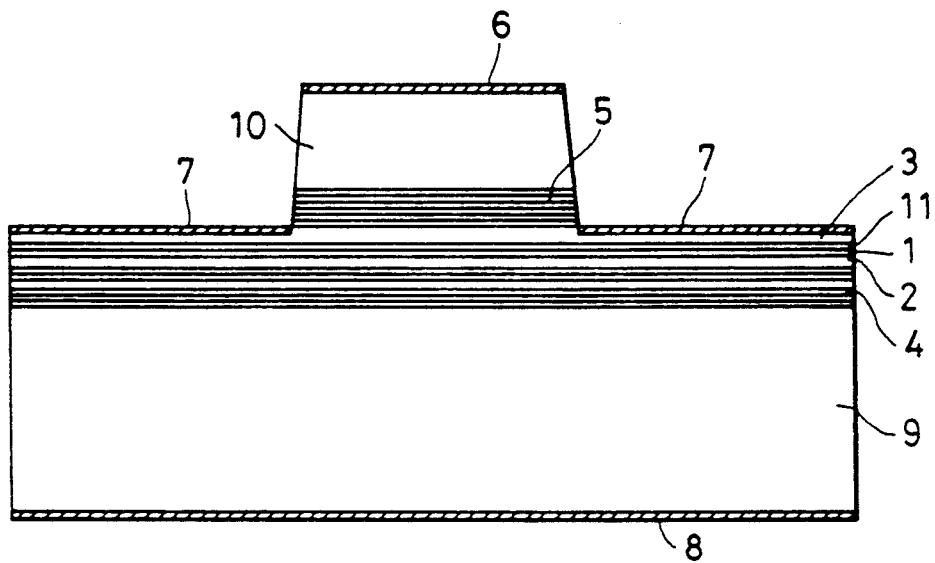
FIG. 1 is a schematic sectional view of a first embodiment of this invention.

FIG. 1 shows a schematic structure of the first embodiment of this invention. In FIG. 1, reference numeral 1 designates a quantum well of a light emitting active layer which is formed with GaAs of 100 Å thickness. On and under the quantum well 1, an intrinsic (i)-AlAs layer 11 of 100 Å thickness/an i-Al$_{0.2}$Ga$_{0.8}$As layer 3 of 1050 Å thickness and an n-Al$_{0.2}$Ga$_{0.8}$As layer 2 of 1135 Å thickness respectively layered. The i-AlAs layer 11 acts as a high potential barrier.

This quantum well structure is sandwiched between layers 4 and 5, which respectively consist of twenty (20) periods of an AlAs barrier of 690 Å thickness/a GaAs well of 571 Å thickness. Both of these layers 4 and 5 are p-doped.

Figure 2:
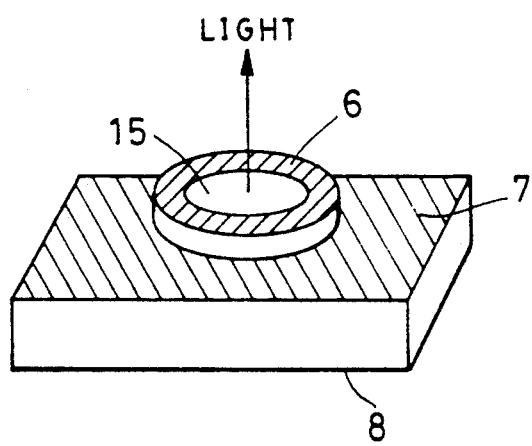
FIG. 2 is a schematic perspective view of the first embodiment.

Further, in FIG. 1, reference numeral 6 is an emitter electrode formed on a cap layer 10, reference numeral 7 is a base electrode formed on the i-layer 3 which is exposed by an etching, and reference numeral 8 is a collector electrode formed on the bottom surface of a substrate 9. The perspective view of the device is depicted in FIG. 2, and light is emitted therefrom through a window 15 formed in the emitter electrode 6. This device is fabricated by a conventional molecular beam epitaxy (MBE) process.

Figure 3A:
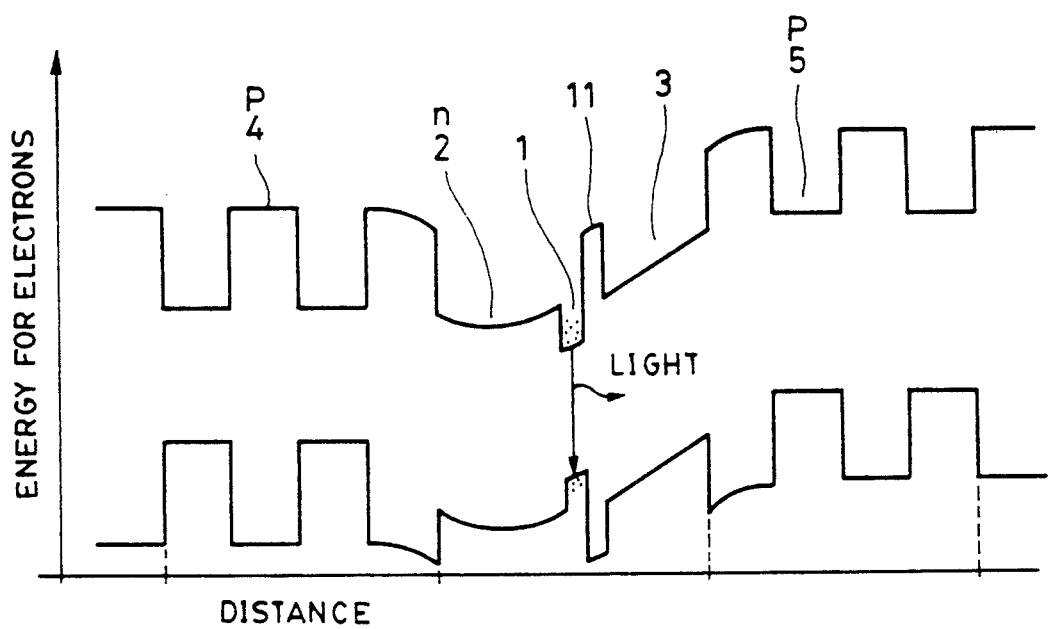
FIG. 3A is a view showing the band structure near a light emission active layer of the first embodiment.

The operation of the first embodiment is as follows. The band structure near the active layer 1 is depicted in FIG. 3A. Holes are injected into the i-Al$_{0.2}$Ga$_{0.8}$As layer 3 by a forward bias between the emitter electrode 6 and the base electrode 7, and the holes are captured by the quantum well layer 1 having a low potential for holes to be recombined with electrons, leading to the light emission. On the other hand, an electric field applied to the quantum well layer 1 can be modulated by altering a voltage between the base electrode 7 and the collector electrode 8. Here, since there is the barrier 11 of a high potential between the layer 3 and the light emitting layer 1, the injected holes would not leak to the layer 3 even if a high voltage is applied to the quantum well layer 1.

Figure 3B:
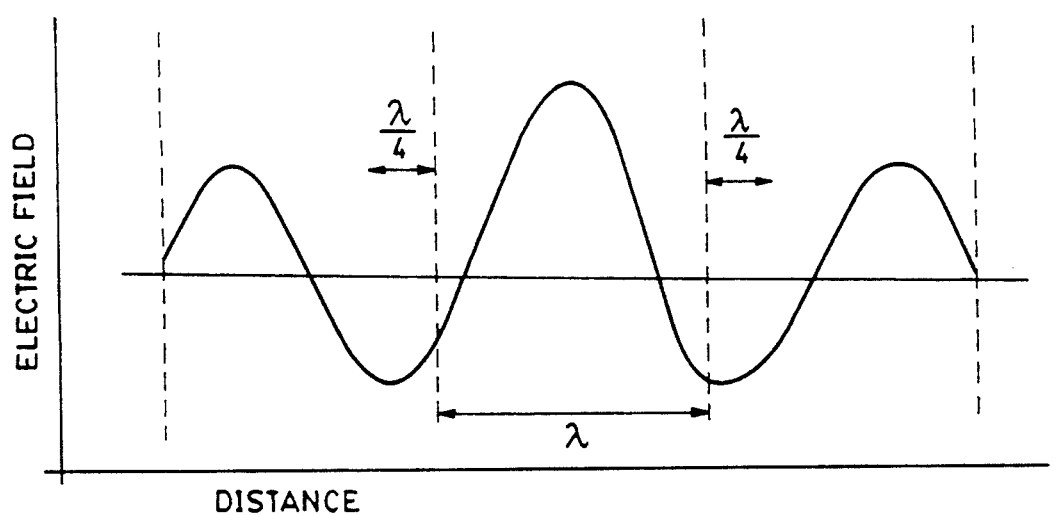
FIG. 3B is a view showing the electric field distribution of light radiated in the active layer.

The device was caused to emit light at liquid-helium temperatures. The wavelength of the light emitted from the quantum well 1 was about 820 nm when no voltage was applied between the base 7 and collector 8, and a half width of light emission was about 2 nm. For this light emission wavelength ($\lambda$), the layers 4 and 5 exhibit an extremely high reflectance because they form a distributed Bragg reflector with their multi-layered films of $\lambda/4$ thickness. Such part as is composed of the layers 1, 2, 3 and 11 has an optical length of an exactly one wavelength $\lambda$. As a result, the electric field amplitude distribution of the light emitted from the quantum well layer 1 becomes as shown in FIG. 3B. Thus, such an electric field has a large amplitude distribution in the light emitting quantum well layer 1. Due to this, the interaction $M(\nu)$ between the atom in the excited state and vacuum field becomes large, so that the transition probability S of the spontaneous emission is enhanced under this condition. In other words, the light emission life time 1/S is shortened. According to the experiment, it was confirmed that the light emission probability of this embodiment was increased about twice as much as the conventional light emitting device not having Bragg reflector 4 and 5.

Next, properties thereof will be explained where a reverse bias is applied between the collector 8 and base 7. If the reverse bias is applied, since the electric field is applied to the quantum well layer 1, electrons and holes are spatially separated from each other by the potential in this layer 1. As a result, the dipole moment of the electron transition will be reduced, so the transition probability S of the spontaneous emission is lowered, leading to a long light emission recombination time.

At the same time, the transition energy of the interband transition becomes small, so that the light emission wavelength $\lambda$ would try to shift to a longer value. However, this longer wavelength is shifted from the resonance condition, as is seen from FIG. 3B, and thus the electric field amplitude distribution of light would not have a maximum value at the location of the light emission active layer 1. Consequently, the interaction $M(\nu)$ between the atom in the excited state and vacuum field will be further reduced so that the transition probability S of spontaneous emission light will further be lowered, compared to the case where no optical cavity or Bragg reflector exists. Thus, the light emission recombination time is greatly lengthened compared to the case where no reverse bias is applied.

According to the experiment, while, in the case where no Bragg reflector exists, the light emission life time at the time of the reverse bias was about ten times larger than that at the time of no reverse bias. In this embodiment with the Bragg reflector, the light emission life time at the time of the electric field became about fifty (50) times larger than that at the time when no electric field is applied.

As has been explained above, in this embodiment, light and electrons are confined one-dimensionally, and the interaction between the electron system and light or electromagnetic field is controlled in magnitude by altering the excited state of the electron system due to the QCSE. Thus, this embodiment succeeded in greatly varying the spontaneous emission transition probability.

Consequently, it becomes possible to increase the modulation depth or on/off ratio of the light emitting device and strengthen the intensity of light output to the outside.

In the first embodiment, light is confined one-dimensionally by the Bragg reflector. Although this Bragg reflector exhibits a high reflectance for light entering along a perpendicular direction, this reflectance is lower for light entering along oblique directions. Therefore, it is difficult to suppress or strengthen the spontaneous emission of slantwise entering light.

Further, if the temperature is high, the spectrum shape $g(\nu)$ of electron transition in the quantum well generally has a wider and gentler peak than the mode density $D(\nu)$ of electromagnetic field, in the case of the one-dimensional confinement. As a result, the overlap between $D(\nu)$ and $g(\nu)$ would not greatly vary even if $g(\nu)$ is shifted due to the QCSE, so the light emission probability or the spontaneous emission transition probability would hardly change.

Figure 4:
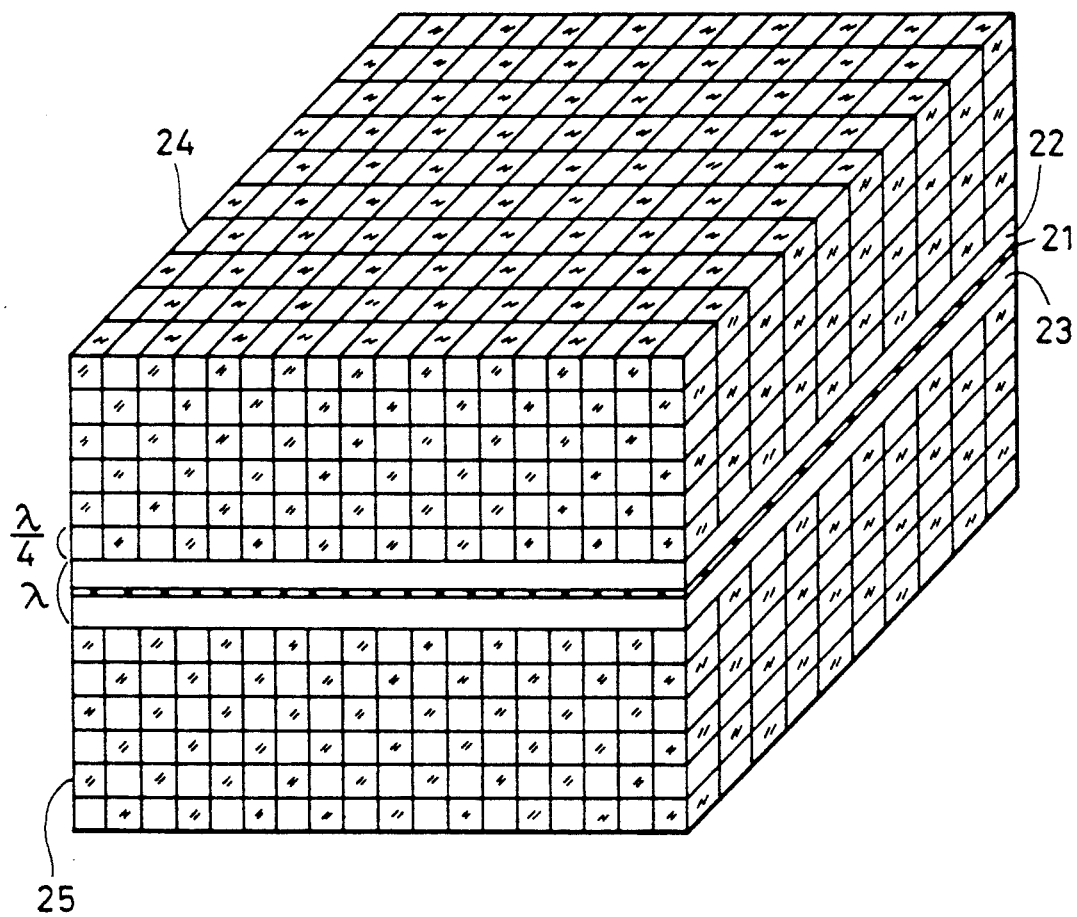
FIG. 4 is a schematic perspective view of a second embodiment of this invention.

The second embodiment as shown in FIG. 4 overcomes this shortcoming.

In the second embodiment, as compared to the first embodiment, one-dimensional Bragg reflector 4, 5 are replaced by three-dimensional Bragg reflector 24, 25, and the quantum well layer 1 of the active layer is replaced by a layer 21 which involves, for instance, quantum boxes for confining electrons and holes three-dimensionally and broad band-gap material around the quantum boxes. The Bragg reflector 24, 25 is composed of, for example, cubic AlAs and GaAs portions that are alternately formed three-dimensionally and have $\lambda/4$ thicknesses. Between the quantum box layer 21 and the Bragg reflector 24, 25, there are formed layers 22 and 23 like the layers 2 and 3 of the first embodiment. Such part as is constructed by the layers 21, 22 and 23 has an optical length of an exactly one wavelength $\lambda$. Further, emitter, base and collector electrodes are formed in a manner similar to the first embodiment.

As a result, both the state density function $D(v)$ of an electromagnetic field and the spectrum shape function $g(v)$ of an electron system in the excited state become like a delta function. Therefore, at room temperatures, the breadth of spectrums of state density functions of both the electron and light or electromagnetic field becomes almost equal to zero in principle. So, as the spectrum function $g(v)$ of the electron system is shifted due to the QCSE caused by applying an electric field or reverse bias to the structure of the quantum box 21, spontaneous emission light will be emitted with an extremely high emission probability when the spectrum shape of the electron coincides with that of the light or when their peaks overlap. On the other hand, the spontaneous emission light is almost completely suppressed when the spectrum shapes deviate from each other.

Consequently, by altering the electric field applied to the quantum box layer 21, the spontaneous emission rate can be varied over a very large ratio.

In the above embodiments, as a structure for confining lights and electrons, the combination of one-dimensional electron confinement structure or quantum well and one-dimensional light confinement structure or one-dimensional Bragg reflector and the combination of three-dimensional electron confinement structure or quantum box and three-dimensional light confinement structure or three-dimensional Bragg reflector are utilized to construct the light emitting device. But, other combinations can be used within the scope of this invention, and a combination of a two-dimensional electron confinement structure or quantum line and the three-dimensional Bragg reflector and a combination of two appropriate electron and light confinement structures selected from one-, two- and three-dimensional electron and light confinement structures may be used.

Further, in the above embodiments, such Bragg reflectors as have uniform periods are used as a light confinement structure, but there is no limitation to the structure of light confinement, either. Chirped distributed reflectors in which the thickness of each layer is chirped to totally reflect all lights incident thereon at various angles, or mere metal mirrors of low loss, etc., may be used.

Further, in the above embodiments, the pnp type transistor structure is adopted as a structure for injecting current into the quantum confinement structure which is a light emission active layer, but other structures may be used within the concept of this invention. For instance, an npn type transistor structure, such a structure in which the pn junction is formed in a direction in the plane of the substrate for current injection and the pn junction is formed in a direction normal to the substrate for application of an electric field, and the like may be used. Further, such a structure may be employed in which an electric field is applied to the quantum confinement structure using a mere pn junction and light emission carriers are generated by optical pumping.

As has been explained in the foregoing, according to this invention, a light emitting device is achieved in which the electric field effect in the light emission active layer may be utilized and there is provided a reflector having a high reflectance for emitted lights. Thus, the light emission efficiency can be made quite high and an extremely high degree of light modulation can be expected. Further, these excellent characteristics can be attained at a very low current density or excitation rate, so that a power cost per one device can be made extremely small. It thereby becomes possible to construct a short distance optical distribution by layering a multiplicity of such devices.

While there has been shown and described what are considered preferred embodiments of the present inventions, it will be obvious to those skilled in the art that various changes and modifications may be made therein without departing from the inventions as defined by the claims.

What is claimed is:

1. A light emitting device comprising:
a light emitting active layer having a quantum confinement structure;
means for supplying carriers to said active layer;
means for applying a reverse bias electric field to said active layer; and
reflector means enclosing said active layer and having a high reflectance for light generated in said active layer,
wherein, said reflector means comprises a pair of reflectors sandwiching the active layer, the optical length between said reflectors being equal to a wavelength of a light generated in the active layer.

2. A light emitting device according to claim 1, wherein said active layer comprises a quantum line structure.

3. A light emitting device according to claim 1, wherein said active layer comprises a quantum box structure.

4. A light emitting device according to claim 1, wherein said reflector means comprises a one-dimensional distributed Bragg reflector.

5. A light emitting device according to claim 1, wherein said reflector means comprises a three-dimensional Bragg reflector.

6. A light emitting device according to claim 1, wherein said reflector means comprises a chirped distributed reflector.

7. A light emitting device according to claim 1, wherein said reflector means comprises a metal mirror of low loss.

8. A light emitting device according to claim 1, wherein said carrier supplying means comprises a transistor structure including an emitter region on one side of the active layer and a collector region on an opposite side of the active layer for injecting current into said active layer.

9. A light emitting device according to claim 1, wherein said carrier supplying means generates the carriers by optical pumping.

10. A method of controlling light emitted from a light emitting device which includes a light emitting active layer having a quantum confinement structure, a reflector means enclosing said active layer including a pair of reflectors sandwiching the active layer and having a high reflectance for light generated in said active layer, said method comprising the steps of:

supplying carriers to said active layer to generate light;

reflecting the generated light by said pair of reflectors with an optical length between reflectors equal to a wavelength of the light generated in the active layer so as to cause the light to resonate;

allowing a part of the resonating light to be emitted from said light emitting device; and allowing a part of the resonating light to be emitted from said light emitting device; and controlling the light emitted from said light emitting device by applying a reverse bias electric field to said active layer.

11. A method according to claim 10, wherein the application of said reverse electric field to said active layer causes a gradient of the potential in the said active layer so that electrons and holes are spatially separated so as to reduce a transition probability of spontaneous emission, whereby the light emission recoupling time is increased.

12. A method according to claim 10, wherein the application of said reverse bias electric field to said active layer causes a tendency for the emission wavelength to be shifted due to a quantum confinement Stark effect so as to deviate from the resonance, whereby a transition probability of spontaneous emission is reduced.

13. A light emitting device comprising:
a light emitting active layer having a quantum confinement structure;
a first semiconductor layer disposed in the vicinity of said active layer and having a first conduction type;
a second semiconductor layer and a third semiconductor layer which have a second conduction type and cooperate with each other in sandwiching said active layer and said first semiconductor layer therebetween, said second and third semiconductor layers each forming a distributed Bragg reflector;
a base electrode electrically connected to said active layer and said first semiconductor layer; and
an emitter electrode and a collector electrode which are electrically connected to said second semiconductor layer and said third semiconductor layer, respectively.

14. A method of driving a light emitting device which comprises a light emitting active layer having a quantum confinement structure, a first semiconductor layer disposed in the vicinity of said active layer and having a first conduction type, a second semiconductor layer and a third semiconductor layer which have a second conduction type and which cooperate with each other in sandwiching said active layer and said first semiconductor layer therebetween, said second and third semiconductor layers each forming a distributed Bragg reflector, a base electrode electrically connected to said active layer and said first semiconductor layer, and an emitter electrode and a collector electrode which are electrically connected to said second semiconductor layer and said third semiconductor layer, respectively, said method comprising the steps of:

applying a forward bias electric field between said emitter electrode and said base electrode so as to supply carriers to said active layer, thereby causing said active layer to generate light;

reflecting the light generated in said active layer by a Bragg reflector so as to cause resonance;

allowing a part of the resonating light to be emitted from said light emitting device; and applying a reverse bias electric field between said collector electrode and said base electrode so as to control the light emitted from said light emitting device.

15. A method according to claim 14, wherein the application of said reverse bias electric field to said active layer causes a gradient of the potential in the said active layer so that electrons and holes are spatially separated so as to reduce a transition probability of spontaneous emission, whereby the light emission recoupling time is increased.

16. A method according to claim 14, wherein the application of said reverse bias electric field to said active layer causes a tendency for the emission wavelength to be shifted due to a quantum confinement Stark effect to deviate from the resonance, whereby a transition probability of spontaneous emission is reduced.

17. A light emitting device comprising:
a substrate;
a first semiconductor layer comprising a p-type semiconductor and provided on said substrate, said first semiconductor layer forming a distributed Bragg reflector;
a second semiconductor layer comprising an n-type semiconductor and provided on said first semiconductor layer;
a light emitting active layer having a quantum well structure and provided on said second semiconductor;
a third semiconductor layer comprising an intrinsic semiconductor and provided in said active layer;
a fourth semiconductor layer comprising a p-type semiconductor and provided on said third semiconductor layer, said fourth semiconductor layer forming a distributed Bragg reflector;
a base electrode contacting said third semiconductor layer;
an emitter electrode electrically connected to said fourth semiconductor layer; and
a collector electrode contacting said substrate.

18. A light emitting device according to claim 17, further comprising a cap layer provided on said fourth semiconductor layer, said emitter electrode contacting said cap layer.

19. A light emitting device according to claim 17, further comprising a barrier layer disposed between said active layer and said third semiconductor layer.

20. A light emitting device according to claim 19, wherein said active layer is made of GaAs, said barrier layer is made of intrinsic AlAs, said third semiconductor layer is made of intrinsic AlGaAs, said second semiconductor layer is made of n-AlGaAs and said first and fourth semiconductor layers each having a periodic structure including a p-AlAs layer and a p-GaAs layer which are laminated alternately.

21. A method of driving a light emitting device which comprises a substrate; a first semiconductor layer comprising a p-type semiconductor and provided on said substrate, said first semiconductor layer forming a distributed Bragg reflector; a second semiconductor layer comprising an n-type semiconductor and provided on said first semiconductor layer; a light emitting active layer having a quantum well structure and provided on said second semiconductor; a third semiconductor layer comprising an intrinsic semiconductor and provided in said active layer; a fourth semiconductor layer comprising a p-type semiconductor and provided on said third semiconductor layer, said fourth semiconductor layer forming a distributed Bragg reflector; a base electrode contacting said third semiconductor layer; an emitter electrode electrically connected to said fourth semiconductor layer; and a collector electrode contacting said substrate, said method comprising the steps of:

applying a forward bias electric filed between said emitter electrode and said base electrode so as to supply carriers to said active layer, thereby causing said active layer to generate light;

reflecting the light generated in said active layer by the Bragg reflector so as to cause resonance;

allowing a part of the resonating light to be emitted from said light emitting device; and applying a reverse bias electric field between said collector electrode and said base electrode so as to control the light emitted from said light emitting device.

22. A method according to claim 21 wherein the application of said reverse bias electric filed to said active layer causes a gradient of the potential in the said active layer so that electrons and holes are spatially separated so as to reduce a transition probability of spontaneous emission, whereby the light emission re-coupling time is increased.

23. A method according to claim 21 wherein the application of said reverse bias electric field to said active layer causes a tendency for the emission wave length to be shifted due to a quantum confinement Stark effect to deviate from the resonance, whereby a transition probability of spontaneous emission is reduced.

* * * * *

UNITED STATES PATENT AND TRADEMARK OFFICE
CERTIFICATE OF CORRECTION

PATENT NO. : 5,289,018
DATED : February 22, 1994
INVENTOR(S) : MASAHIRO OKUDA ET AL.

It is certified that error appears in the above-identified patent and that said Letters Patent is hereby corrected as shown below:

AT [56] REFERENCES CITED

Foreign Patent Documents,
"1-10946  4/1989  Japan" should read
--1-094689  4/1989  Japan--.

Other Publications,
In Lasing Acting,
""Lasing Acting In GaInAs/GaInAsp Quantum Wire Structure"" should read --"Lasing Action In GaInAs/GaInAsp Quantum Wire Structure"-- and
"Japan pp. 63-39." should read --Japan pp. 63-69.--.
In Quantum Mechanical,
"M. Yamanishi" should read --M. Yamanishi et al.--
In Qauntum Optics,
""Qauntum" should read --Quantum--.

COLUMN 1

Line 58, "having" should read --having a--.
Line 59, "20:1" should read --20:1,--.

UNITED STATES PATENT AND TRADEMARK OFFICE
CERTIFICATE OF CORRECTION

PATENT NO. : 5,289,018

DATED : February 22, 1994

INVENTOR(S) : MASAHIRO OKUDA ET AL.

Page 2 of 2

It is certified that error appears in the above-identified patent and that said Letters Patent is hereby corrected as shown below:

<u>COLUMN 10</u>

Line 3, "claim 21" should read --claim 21,--.
    Line 4, "filed" should read --field.
    Line 11, "claim 21" should read --claim 21,--.

Signed and Sealed this

Seventeenth Day of January, 1995

Attest:

BRUCE LEHMAN

*Attesting Officer*    *Commissioner of Patents and Trademarks*